(12) United States Patent  (10) Patent No.: US 8,084,916 B2
Goto et al.  (45) Date of Patent: Dec. 27, 2011

(54) ACOUSTIC WAVE DEVICE AND ELECTRONIC EQUIPMENT USING THE SAME

(75) Inventors: Rei Goto, Osaka (JP); Hidekazu Nakanishi, Osaka (JP); Hiroyuki Nakamura, Osaka (JP)

(73) Assignee: Panasonic Corporation, Osaka (JP)

( * ) Notice: Subject to any disclaimer, the term of this patent is extended or adjusted under 35 U.S.C. 154(b) by 349 days.

(21) Appl. No.: 12/552,606

(22) Filed: Sep. 2, 2009

(65) Prior Publication Data

US 2010/0060102 A1 Mar. 11, 2010

(30) Foreign Application Priority Data

Sep. 5, 2008 (JP) ................................. 2008-227942

(51) Int. Cl.
*H03H 9/25* (2006.01)
(52) U.S. Cl. ................. 310/313 R; 310/313 B; 310/340
(58) Field of Classification Search ............... 310/313 R, 310/313 B, 340
See application file for complete search history.

(56) References Cited

U.S. PATENT DOCUMENTS

| 4,204,178 | A | * | 5/1980 | Mitchell | 333/194 |
| 5,010,270 | A | * | 4/1991 | Greer | 310/313 D |
| 6,013,221 | A | * | 1/2000 | Byer et al. | 264/436 |
| 2008/0179989 | A1 | | 7/2008 | Ogami et al. | |

FOREIGN PATENT DOCUMENTS

WO 2007/046236 4/2007

\* cited by examiner

*Primary Examiner* — Thomas M Dougherty
(74) *Attorney, Agent, or Firm* — Wenderoth, Lind & Ponack, L.L.P.

(57) ABSTRACT

An acoustic wave device has: a piezoelectric body; an interdigital electrode that is arranged on the piezoelectric body and excites an acoustic wave; and a dielectric layer that is arranged on the piezoelectric body so as to cover the interdigital electrode. The dielectric layer includes a composition changing portion made up of a medium where propagation velocity of a transverse wave continuously increases upward. With this configuration, it is possible to shift a spurious radiation by a high-order mode that propagates inside the dielectric layer to a higher frequency, so as to reduce an influence of the spurious radiation by the high-order mode.

6 Claims, 5 Drawing Sheets

US 8,084,916 B2

ACOUSTIC WAVE DEVICE AND ELECTRONIC EQUIPMENT USING THE SAME

FIELD OF THE INVENTION

The present invention relates to an acoustic wave device and electronic equipment using the same.

BACKGROUND OF THE INVENTION

A conventional acoustic wave device is described by use of FIG. 7. FIG. 7 is a sectional schematic view of the conventional acoustic wave device. In FIG. 7, conventional acoustic wave device 1 has piezoelectric body 2, interdigital electrode 3 arranged on piezoelectric body 2, and dielectric layer 4 arranged so as to cover interdigital electrode 3.

As related art document information regarding this application, for example, International Publication No. 2007-046236 (Patent Document 1) is known.

It is disclosed that in conventional acoustic wave device 1, a medium where propagation velocity of a transverse wave of $SiO_2$ or the like is relatively low is used as dielectric layer 4, thereby to propagate an acoustic wave with its energy confined on a boundary between piezoelectric body 2 and dielectric layer 4. However, there has been a problem in that, when a film thickness of the dielectric layer is made not smaller than 0.8 times as large as a wavelength of a main wave in an attempt to confine the main wave inside acoustic wave device 1, a spurious radiation by a high-order mode is generated in the vicinity of a frequency of the main wave.

SUMMARY OF THE INVENTION

An acoustic wave device of the present invention has: a piezoelectric body; an interdigital electrode that is arranged on the piezoelectric body and excites an acoustic wave; and a dielectric layer that is arranged on the piezoelectric body so as to cover the interdigital electrode. This dielectric layer includes a composition changing portion made up of a medium where propagation velocity of a transverse wave continuously increases in a direction from a boundary surface in contact with the piezoelectric body to an upper surface of the dielectric layer.

In the medium in the vicinity of the upper surface of the dielectric layer, the propagation velocity of the transverse wave is high, and hence a spurious radiation by a high-order mode that propagates inside the dielectric layer can be shifted to a higher frequency, so as to reduce an influence of the spurious radiation by the high-order mode. Further, as compared with an acoustic wave device having a composition of the dielectric layer clearly separated between upper and lower portions, the number of times of sputtering performed in a manufacturing process for the acoustic wave device of the present invention can be made small, so as to improve productivity.

DESCRIPTION OF THE EXEMPLARY EMBODIMENT

Figure 1:
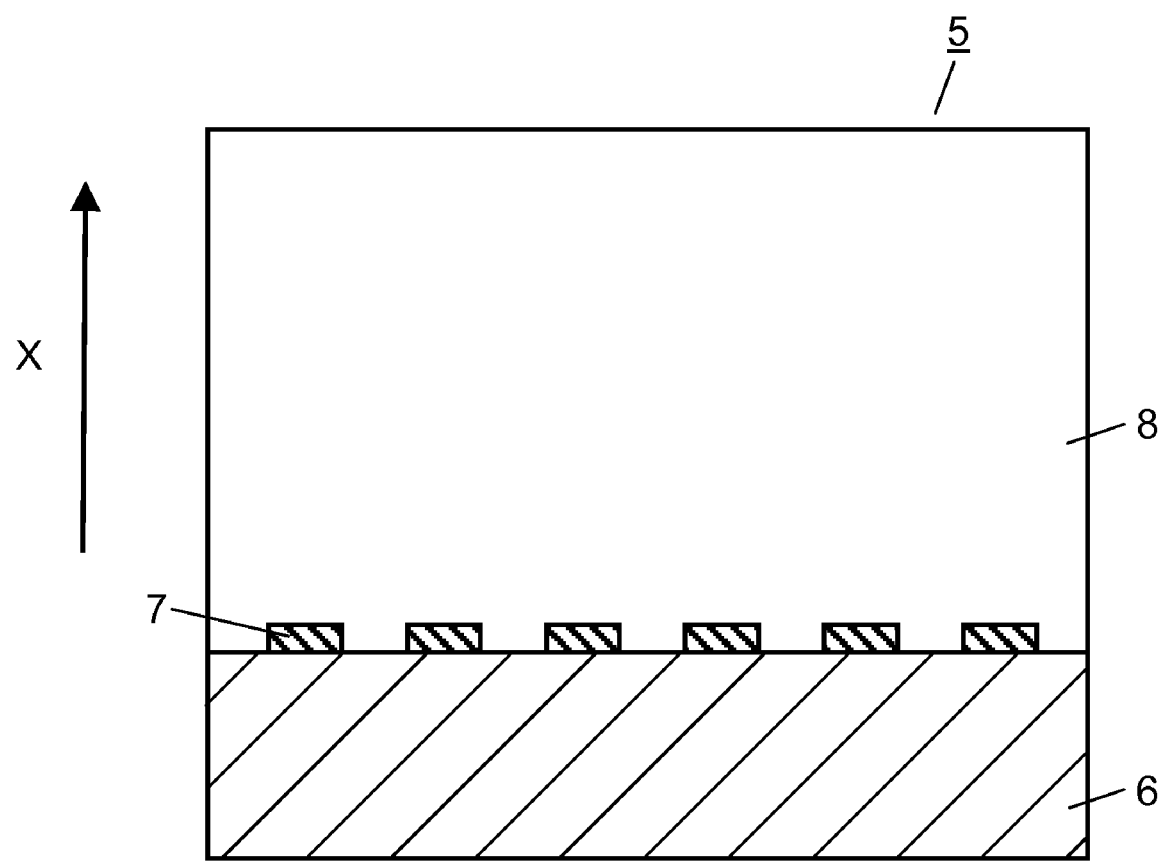
FIG. 1 is a sectional schematic view of an acoustic wave device according to the present invention.

In the following, an acoustic wave device in an embodiment of the present invention is described with reference to drawings. FIG. 1 is a sectional schematic view of the acoustic wave device in the embodiment. In FIG. 1, acoustic wave device 5 has piezoelectric body 6, interdigital electrode 7 provided on this piezoelectric body 6, and dielectric layer 8 provided on piezoelectric body 6 so as to cover interdigital electrode 7.

Piezoelectric material 6 is made up, for example, of lithium niobate, lithium tantalate or potassium niobate.

Interdigital electrode 7 is a simple metal made up, for example, of aluminum, copper, silver, gold, titanium, tungsten, platinum or chromium, or an alloy containing these metals.

Dielectric layer 8 includes a composition changing portion (not shown) where a composition continuously changes in a direction from a boundary surface between piezoelectric body 6 and dielectric layer 8 to an upper surface of dielectric layer 8. This composition changing portion is made up of a medium where propagation velocity of the transverse wave continuously increases upward in a thickness direction of dielectric layer 8. In FIG. 1, the upward direction is indicated by an arrow X.

For example, dielectric layer 8 has: a portion made up only of silicon oxide in the vicinity of the boundary surface between piezoelectric body 6 and dielectric layer 8; a portion provided thereon where a silicon oxide concentration continuously decreases upward while a silicon nitride concentration continuously increases upward; and a portion provided thereon which is made up of silicon nitride. It is to be noted that dielectric layer 8 may not have the portion made up only of silicon oxide or the portion made up only of silicon nitride, but the whole of dielectric layer 8 may be made up of the composition changing portion.

Further, the composition changing portion may further includes silicon oxynitride. At this time, a silicon oxynitride concentration in between the lower end and the upper end of the composition changing portion is larger than the silicon oxynitride concentration each at the lower end and the upper end of the composition changing portion.

It should be noted that a film thickness of dielectric layer 8 is not smaller than 0.8 times as large as a wavelength of a main wave. The main wave can thereby be confined in the vicinity of interdigital electrode 7. In addition, when the film thickness of dielectric layer 8 is not smaller than the wavelength of the main wave, the main wave can be almost completely confined inside acoustic wave device 5.

Figure 2:
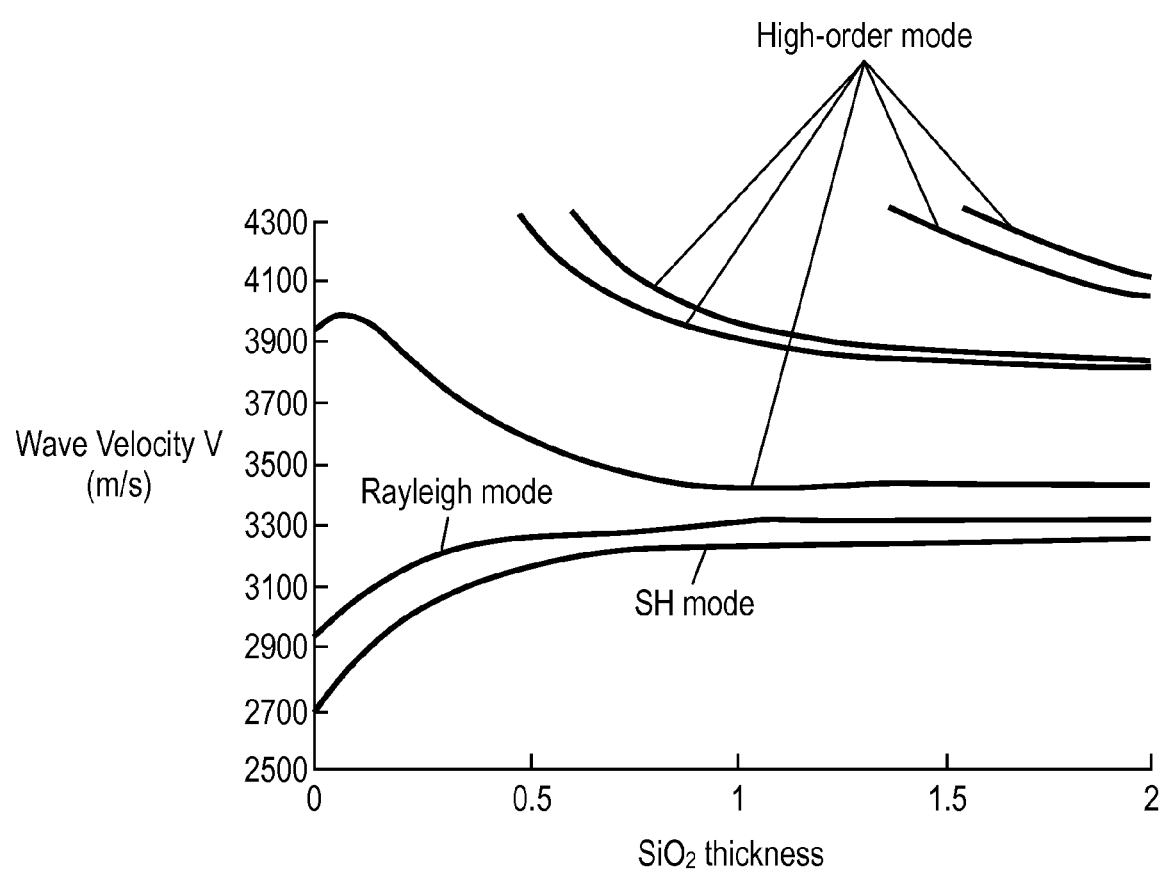
FIG. 2 is a diagram showing a sonic characteristic of a conventional acoustic wave device.

FIG. 2 is a diagram showing a sonic characteristic of a conventional acoustic wave device. FIG. 2 shows a relation between a film thickness H/λ of dielectric layer 4 standardized by the wavelength of the main wave and a wave velocity V in a case where 15-degree rotated, Y-cut lithium niobate is used as piezoelectric body 2, gold is used as interdigital electrode 3, and silicon oxide is used as dielectric layer 4. It is to be noted that the calculation is made with a film thickness of interdigital electrode 3 being 0.06 k. FIG. 2 indicates that a large number of Rayleigh modes and high-order modes exist other than the main wave as an SH wave mainly including the transverse wave.

Since the modes other than the main wave degrades as spurious radiations frequency characteristics of acoustic wave device 1, these modes are desirably suppressed. The spurious radiation by the Rayleigh mode can be suppressed by changing a cut square of piezoelectric body 2. However, since the high-order mode includes a mode mainly including an SH component having a high coupling factor, it is difficult to suppress this mode by controlling the cut square.

The high-order mode is generated by being repeatedly reflected on the upper surface of dielectric layer 4 and on the boundary between piezoelectric body 2 and dielectric layer 4, and propagating with energy confined inside dielectric layer 4. Hence propagation velocity of the high-order mode depends upon the film thickness of dielectric layer 4 to a large degree. Namely, as shown in FIG. 2, when the film thickness of dielectric layer 4 is not smaller than λ, the propagation velocity of the high-order mode decreases. This has caused a problem of generation of the spurious radiation by the high-order mode in the vicinity of the frequency of the main wave.

In acoustic wave device 5 of the embodiment in the present invention, the vicinity of the upper surface of dielectric layer 8 is a medium where the propagation velocity of the transverse wave is high, whereby it is possible to shift the spurious radiation by the high-order mode that propagates inside dielectric layer 8 to a higher frequency, so as to reduce an influence of the spurious radiation by the high-order mode.

Figure 3:
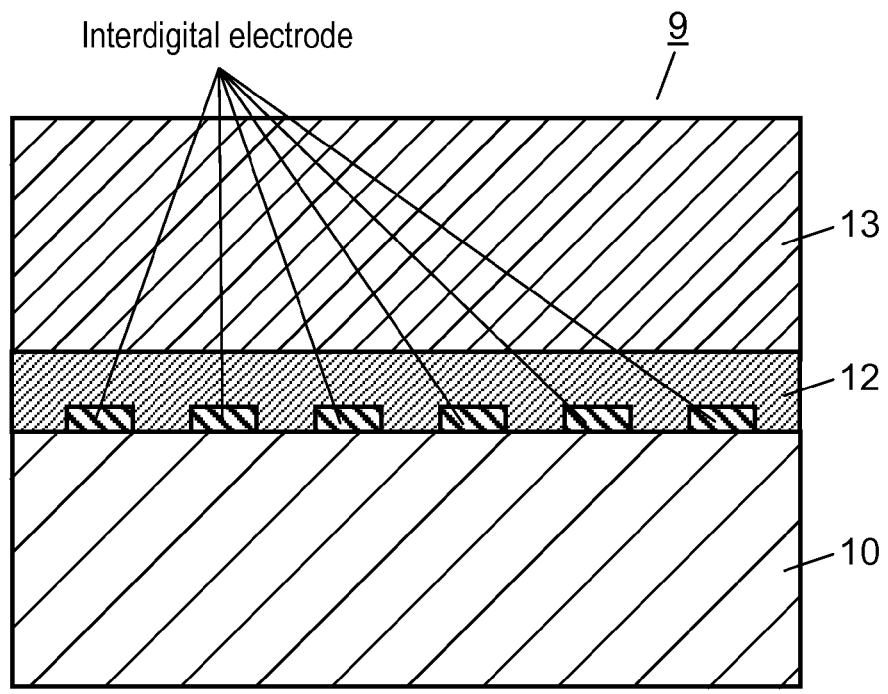
FIG. 3 is a view showing a dielectric layer, separated between the upper and lower portions, of the conventional acoustic wave device.

FIG. 3 is a view showing a dielectric layer of the conventional acoustic wave device, which is separated between upper and lower portions. As compared with acoustic wave device 9 sequentially having $SiO_2$ layer 12 on piezoelectric body 10 and SiN layer 13 on $SiO_2$ layer 12, namely acoustic wave device 9 having a composition of the dielectric layer clearly separated between upper and lower portions, the number of times of sputtering performed in a manufacturing process for dielectric layer 8 of the present invention can be made small, so as to improve productivity.

Figure 4:
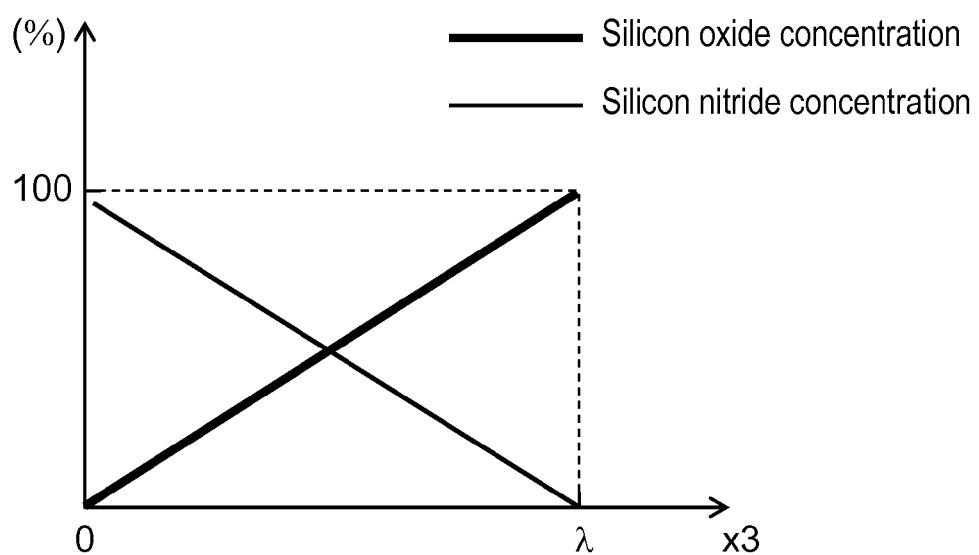
FIG. 4 is a diagram showing a composition distribution inside the dielectric layer in an embodiment of the present invention.
Figure 5:
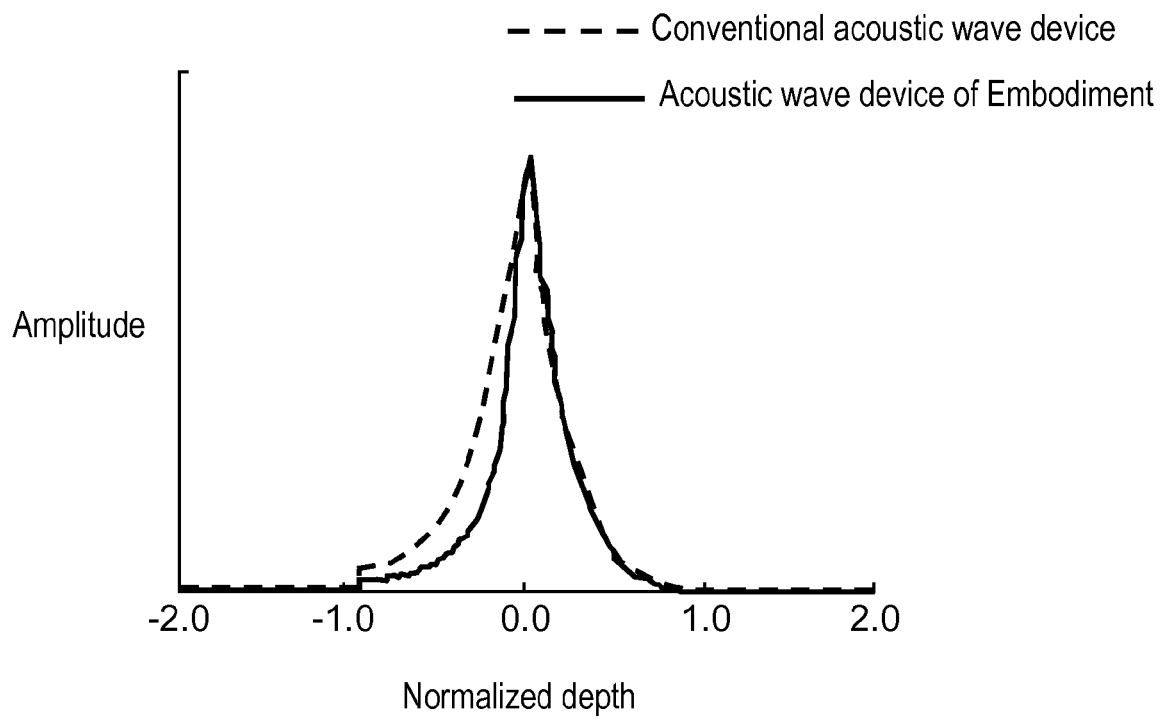
FIG. 5 is a diagram showing displacement distributions of a main wave of the acoustic wave device in the embodiment of the present invention and a conventional main wave.

Next, characteristics of acoustic wave device 5 according to the present embodiment which is provided with dielectric layer 8 having the composition distribution shown in FIG. 4 are compared with characteristics of the conventional acoustic wave device 1 in Table 1 and FIG. 5. Here, thicknesses of conventional dielectric layer 4 and dielectric layer 8 of the embodiment are defined as 1λ.

TABLE 1

|  |  | Velocity [m/s] | Electromechanical coupling factor |
|---|---|---|---|
| Main wave | Conventional configuration | 3243 | 0.179 |
|  | Embodiment | 3474 | 0.194 |
| High-order mode | Conventional configuration | 3933 | 0.0091 |
|  | Embodiment | 4619 | 0.0010 |

FIG. 4 is a diagram showing a composition distribution inside dielectric layer 8 in the embodiment of the present invention. FIG. 4 is the composition distribution in the case of the whole of dielectric layer 8 being the composition changing portion. A horizontal axis indicates a height of dielectric layer 8, and a vertical axis indicates a ratio of the composition distribution of the dielectric layer. As shown in FIG. 4, in dielectric layer 8, a height from the boundary between piezoelectric body 6 and dielectric layer 8 is x3. The composition continuously changes such that the ratio of silicon oxide to silicon nitride is 1:0 in x3=0 and the ratio of silicon oxide to silicon nitride is 0:1 in x3=1λ, and the change in composition is a linear change.

Further, the characteristics of the acoustic wave device shown in Table 1 are sonic velocity and a coupling factor of the main wave, and velocity and an electromechanical coupling factor of a first high-order mode mainly including an SH wave.

Table 1 indicates that, with respect to the electromechanical coupling factor of the high-order mode, the coupling factor has decreased to a large degree in the acoustic wave device of the embodiment as compared with the conventional acoustic wave device. In other words, acoustic wave device 5 of the present invention can make a level of the spurious radiation by the high-order mode small, so as to improve the frequency characteristics. Further, Table 1 indicates that, with respect to the velocity of the high-order mode, acoustic wave device 5 of the embodiment can distance the high-order mode from the main wave, as compared with conventional acoustic wave device 1. With the embodiment of the present invention performed, the velocity of the high-order mode has significantly increased by 686 m/s as compared with the conventional one, whereas the velocity of the main wave has increased by 231 m/s as compared with the conventional one. This indicates that the frequency of the spurious radiation by the high-order mode is away from the frequency of the main wave, and this allows improvement in frequency characteristics.

Further, Table 1 indicates that replacement of conventional acoustic wave device 1 with acoustic wave device 5 of the present embodiment has led to an increase in electromechanical coupling factor of the main wave. This is considered because, in dielectric layer 8, with distance from the boundary between piezoelectric body 6 and dielectric layer 8, the medium becomes one where the propagation velocity of a bulk wave is higher, and thereby the energy of the main wave is efficiently confined in acoustic wave device 1.

Next, with respect to an SH wave component of the displacement distribution in the main wave, FIG. 5 shows a result of comparison between conventional acoustic wave device 1 and acoustic wave device 5 of the present embodiment. FIG. 5 is a diagram showing displacement distributions of the main wave of the acoustic wave device in the embodiment of the present invention and the conventional main wave. FIG. 5 indicates that energy confinement efficiency of the main wave of acoustic wave device 5 in the present embodiment has improved from conventional acoustic wave device 1. The improvement in energy confinement efficiency can make the film thickness of dielectric layer 8 further smaller, so as to improve the productivity.

Further, there has been a problem of cracking of a wafer due to accumulation of stress at the time of producing a film of silicon nitride with a large thickness. According to the present embodiment, since stress is applied dispersedly, stress applied to a wafer can be alleviated, to suppress cracking of the wafer so as to improve a product yield.

Figure 6:
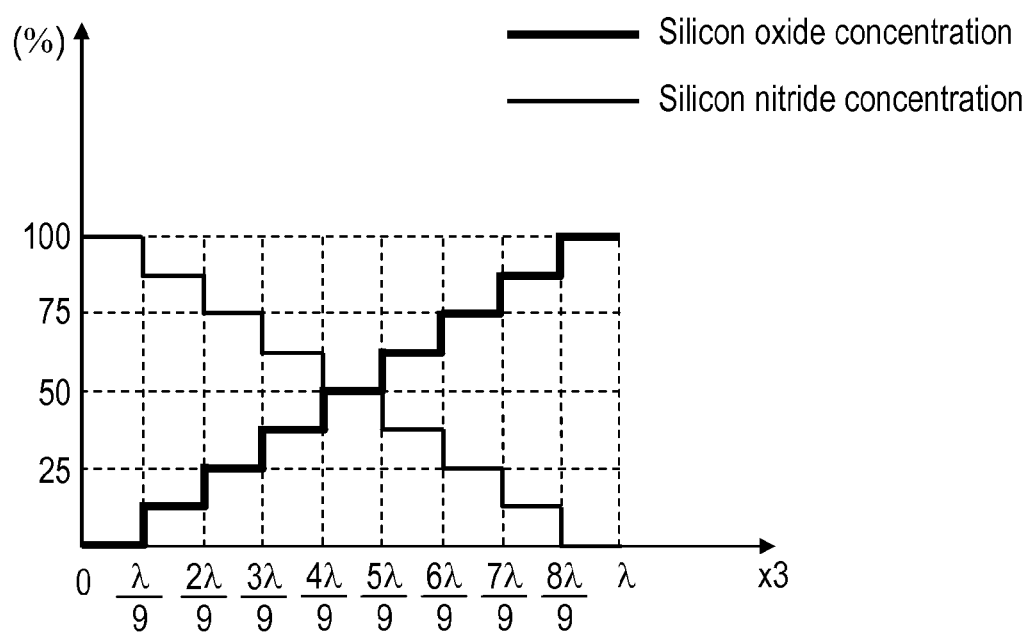
FIG. 6 is a diagram showing a stepwise composition distribution inside the dielectric material in the embodiment of the present invention.
Figure 7:
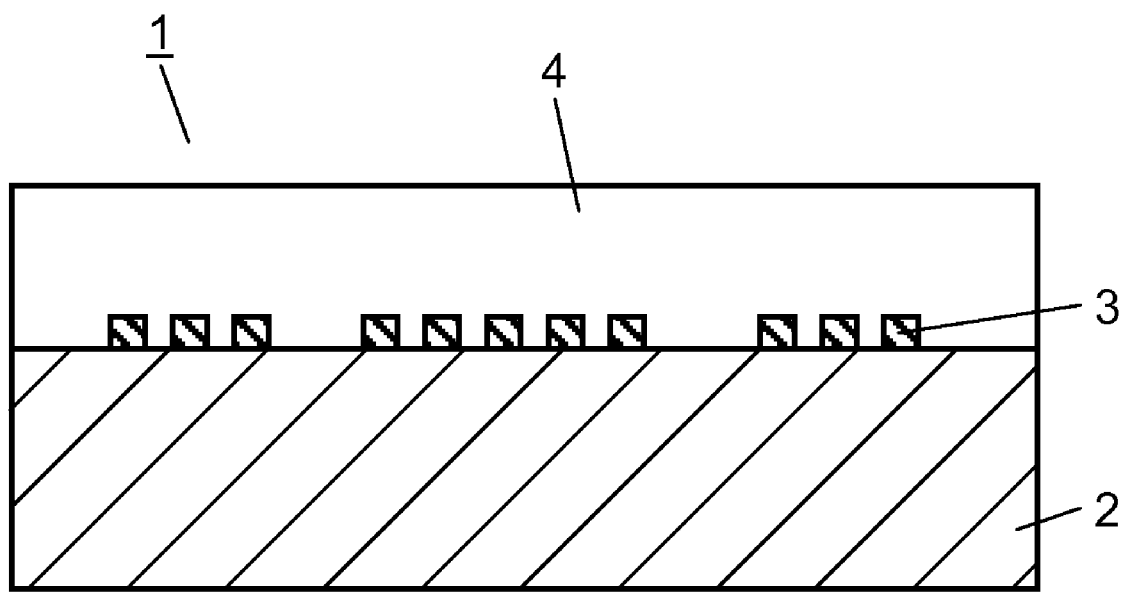
FIG. 7 is a sectional schematic view of the conventional acoustic wave device.

FIG. 6 is a diagram showing a stepwise composition distribution inside the dielectric material in the embodiment of the present invention. As shown in FIG. 6, also in the case of the composition changing portion of dielectric layer 8 making a composition change not continuously but stepwise, it is possible to suppress the spurious radiation by the high-order mode so long as the film thickness at each stage with the same composition is smaller than one eighth of a wavelength λ of the main wave.

Acoustic wave device 5 of the present embodiment is applicable to a resonator (not shown), and also applicable to a filter such as a ladder type filter or a DMS filter (not shown). Further, acoustic wave device 5 may be applied to a filter, and this filter may be connected to a semiconductor integrated circuit device (not shown). Moreover, a filter including acoustic wave device 5 may be applied to electronic equipment equipped with a reproducer using a semiconductor integrated circuit device (not shown). It is thereby possible to improve communication qualities in the resonator, the filter and the electronic equipment.

The acoustic wave device according to the present invention has a characteristic of suppressing a spurious radiation by a high-order mode, and is broadly applicable to communication equipment such as mobile phone, and electronic equipment.

What is claimed is:

1. An acoustic wave device, comprising:
   a piezoelectric body;
   an interdigital electrode that is arranged on the piezoelectric body and excites an acoustic wave; and
   a dielectric layer that is arranged on the piezoelectric body so as to cover the interdigital electrode,
   wherein the dielectric layer includes a composition changing portion made up of a medium in which propagation velocity of a transverse wave continuously or stepwise increases upward.

2. The acoustic wave device according to claim 1, wherein the composition changing portion includes silicon oxide and silicon nitride, in which the silicon oxide concentration continuously decreases upward and the silicon nitride concentration continuously increases upward.

3. The acoustic wave device according to claim 2, wherein the composition changing portion further includes silicon oxynitride, and a silicon oxynitride concentration between a lower end and an upper end of the composition changing portion is larger than the silicon oxynitride concentration each at the lower end and the upper end of the composition changing portion.

4. The acoustic wave device according to claim 1, wherein the piezoelectric body is any one of lithium niobate, lithium tantalate and potassium niobate.

5. The acoustic wave device according to claim 1, wherein a film thickness of the dielectric layer is larger than 0.8 times as much as a wavelength of the acoustic wave.

6. Electronic equipment, installed with an acoustic wave device according to claim 1.

* * * * *